United States Patent
Yamaki et al.

(10) Patent No.: US 10,121,728 B2
(45) Date of Patent: Nov. 6, 2018

(54) THIN FILM CAPACITOR AND SEMICONDUCTOR DEVICE WITH IMPROVED HEAT DISSIPATION

(71) Applicant: TDK CORPORATION, Tokyo (JP)

(72) Inventors: Masahiro Yamaki, Tokyo (JP); Hitoshi Saita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/217,111

(22) Filed: Jul. 22, 2016

(65) Prior Publication Data

US 2017/0025324 A1    Jan. 26, 2017

(30) Foreign Application Priority Data

Jul. 22, 2015    (JP) ................. 2015-145087

(51) Int. Cl.
| | |
|---|---|
| H01L 23/58 | (2006.01) |
| H01L 23/42 | (2006.01) |
| H01G 4/33 | (2006.01) |
| H01G 4/005 | (2006.01) |
| H01G 2/14 | (2006.01) |
| H01L 23/00 | (2006.01) |
| H01L 49/02 | (2006.01) |
| H01G 4/012 | (2006.01) |
| H01G 4/224 | (2006.01) |
| H01L 23/367 | (2006.01) |

(Continued)

(52) U.S. Cl.
CPC ............ *H01L 23/42* (2013.01); *H01G 2/14* (2013.01); *H01G 4/005* (2013.01); *H01G 4/012* (2013.01); *H01G 4/224* (2013.01); *H01G 4/33* (2013.01); *H01L 23/3677* (2013.01); *H01L 23/49822* (2013.01); *H01L 24/16* (2013.01); *H01L 28/82* (2013.01); *H01L 28/84* (2013.01); *H01G 4/1227* (2013.01); *H01L 23/49816* (2013.01); *H01L 23/49827* (2013.01); *H01L 2224/16265* (2013.01); *H01L 2924/19015* (2013.01); *H01L 2924/19041* (2013.01); *H01L 2924/19102* (2013.01)

(58) Field of Classification Search
CPC .............. H01G 4/005; H01L 23/49816; H01L 2924/19102; H01L 2924/19041; H01L 28/84; H01L 28/82
USPC ....................................................... 257/401
See application file for complete search history.

(56) References Cited

U.S. PATENT DOCUMENTS

| | | | | |
|---|---|---|---|---|
| 5,968,209 A | * | 10/1999 | Kono | ............ H01G 9/04 216/6 |
| 6,087,217 A | * | 7/2000 | Li | ............ H01L 28/84 257/E21.013 |

(Continued)

FOREIGN PATENT DOCUMENTS

JP    2007-258430 A    10/2007

*Primary Examiner* — Joseph C Nicely
*Assistant Examiner* — Wilner Jean Baptiste
(74) *Attorney, Agent, or Firm* — Oliff PLC

(57) ABSTRACT

The present invention provides a thin film capacitor including a first electrode layer, a second electrode layer, and a dielectric layer provided between the first electrode layer and the second electrode layer, wherein a ratio ($S/S_0$) of a surface area S of a surface of the first electrode layer on an opposite side to the dielectric layer to a projected area $S_0$ in a thickness direction of the first electrode layer is 1.01 to 5.00.

5 Claims, 8 Drawing Sheets

(51) Int. Cl.
*H01G 4/12* (2006.01)
*H01L 23/498* (2006.01)

(56) References Cited

U.S. PATENT DOCUMENTS

| | | | | |
|---|---|---|---|---|
| 6,380,622 | B1* | 4/2002 | Hirai | H01L 24/72 257/618 |
| 7,276,412 | B2* | 10/2007 | Kim | H01L 23/5223 257/213 |
| 8,169,051 | B2* | 5/2012 | Yoshimura | H01G 4/005 257/532 |
| 2005/0085008 | A1* | 4/2005 | Derderian | H01L 21/6835 438/106 |
| 2005/0191437 | A1* | 9/2005 | Marsh | C23C 16/56 427/569 |
| 2006/0211212 | A1* | 9/2006 | Baniecki | H01L 27/016 438/396 |
| 2007/0097596 | A1* | 5/2007 | Kuwajima | H01G 4/01 361/311 |
| 2007/0242440 | A1* | 10/2007 | Sugaya | H01L 23/3128 361/762 |
| 2011/0019335 | A1* | 1/2011 | Wu | H01G 4/005 361/303 |
| 2014/0268574 | A1* | 9/2014 | Itoi | H01L 23/5389 361/712 |
| 2015/0075853 | A1* | 3/2015 | Lee | H01G 2/06 174/260 |

* cited by examiner

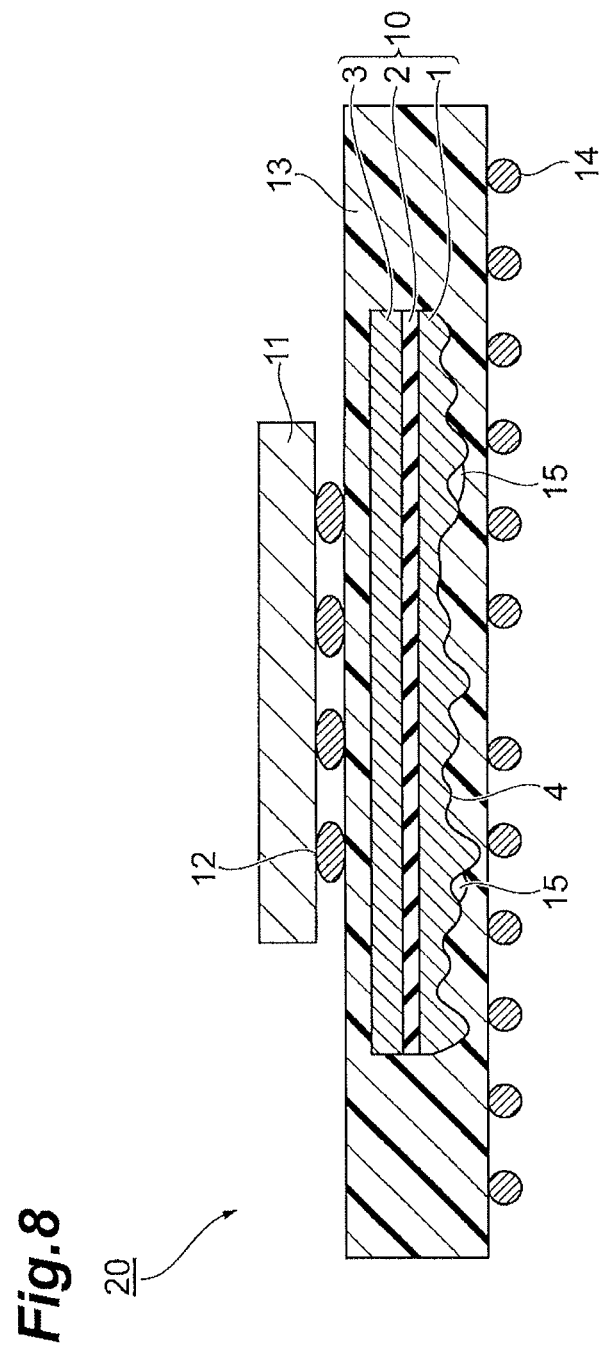

THIN FILM CAPACITOR AND SEMICONDUCTOR DEVICE WITH IMPROVED HEAT DISSIPATION

TECHNICAL FIELD

The present invention relates to a thin film capacitor and a semiconductor device.

BACKGROUND

Conventionally, as described in Japanese Unexamined Patent Publication Application No. 2007-258430, a semiconductor device including a semiconductor element and a capacitor which functions as a bypass capacitor (decoupling capacitor) is known.

SUMMARY

In recent years, as a semiconductor element is highly functionalized and accelerated, the amount of heat from the semiconductor element has been increasing. Various mechanisms for increasing a radiation amount in a semiconductor device such as adoption of a heat spreader have been considered conventionally, however, it cannot be said that radiation efficiency in the semiconductor device is sufficient.

The present inventors have been examining a semiconductor device having a form in which a thin film capacitor functional as a bypass capacitor is embedded inside a support substrate where a semiconductor element is mounted. In such a semiconductor device, heat radiation through the support substrate can be promoted by means of the thin film capacitor, however, further improvement of heat radiation is demanded.

An object of the present invention, which has been made in consideration of the above-described problem, is to provide a semiconductor device capable of efficiently dissipating heat from a heat source such as a semiconductor element, and a thin film capacitor used therefor.

The present invention provides a thin film capacitor comprising a first electrode layer, a second electrode layer, and a dielectric layer provided between the first electrode layer and the second electrode layer, wherein a ratio ($S/S_0$) of a surface area S of a surface of the first electrode layer on an opposite side to the dielectric layer to a projected area $S_0$ in a thickness direction of the first electrode layer is 1.01 to 5.00.

The thin film capacitor relating to the present invention can be used by being embedded inside a support substrate where a semiconductor device is mounted, in such a direction that the second electrode layer faces a heat source such as a semiconductor element. Then, since the ratio $S/S_0$ is 1.01 or higher, in the semiconductor device obtained by using the thin film capacitor, heat generated from the semiconductor element can be received in the second electrode layer and efficiently dissipated outwards from the first electrode layer. In the meantime, since the ratio $S/S_0$ is 5.00 or lower, when embedded inside the support substrate, generation of voids near a lower surface of the first electrode layer (lower electrode layer) inside the support substrate can be reduced. Since heat conductivity of air is 0.02614 (W/(m·K)) at a temperature 300 (K) and is extremely low compared to metals, decline of heat radiation can be suppressed by reducing a generation amount of voids. Therefore, according to the thin film capacitor of the present invention, the semiconductor device capable of efficiently dissipating generated heat from the semiconductor element can be obtained.

In the above-described thin film capacitor, it is preferable that the heat conductivity λ of the first electrode layer is 90 W/(m·K) or higher. By the thin film capacitor having the above-described configuration, the semiconductor device capable of more efficiently dissipating the generated heat from the semiconductor element tends to be obtained. Note that, in the present specification, the heat conductivity λ means the heat conductivity at the temperature 300 (K).

In the above-described thin film capacitor, it is preferable that ten-point average roughness Rz of the surface of the first electrode layer on an opposite side to the dielectric layer is 0.02 to 2.00 μm. By the thin film capacitor having the above-described configuration, the semiconductor device capable of more efficiently dissipating the generated heat from the semiconductor element tends to be obtained.

The present invention further provides a semiconductor device comprising a support substrate, a semiconductor element mounted on one main surface of the support substrate, and the thin film capacitor described above, wherein the thin film capacitor is embedded inside the support substrate in such a way that the second electrode layer and the semiconductor element face each other. According to the above-described semiconductor device, the generated heat from the semiconductor element can be efficiently dissipated, and generation of a short-circuit defect or the like can be suppressed even without having a complicated structure.

According to the present invention, a semiconductor device capable of efficiently dissipating generated heat from a semiconductor element, and a thin film capacitor used therefor can be provided.

BRIEF DESCRIPTION OF THE DRAWINGS

FIG. 3A is a side view of a semiconductor device when measuring a semiconductor element temperature, and FIG. 3B is a top view;

FIG. 8 is a schematic sectional view of the semiconductor device obtained in examples 6 to 12.

DETAILED DESCRIPTION

Hereinafter, an embodiment of the present invention will be described in detail. Note that the present invention is not limited to the following embodiment.

(Thin Film Capacitor)

Figure 1:
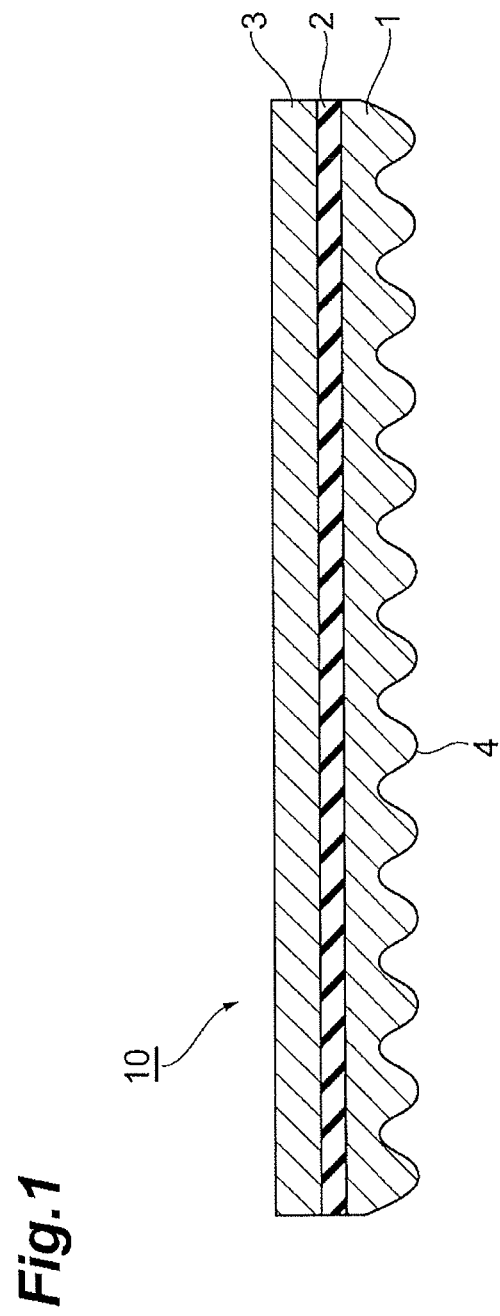
FIG. 1 is a schematic sectional view of a thin film capacitor relating to one embodiment of the present invention.

FIG. 1 is a schematic sectional view of a thin film capacitor relating to one embodiment of the present invention. A thin film capacitor 10 comprises a first electrode layer (sometimes referred to as a lower electrode layer, hereinafter) 1, a second electrode layer (sometimes referred to as an upper electrode layer, hereinafter) 3, and a dielectric layer 2 provided between the first electrode layer 1 and the second electrode layer 3. In other words, the thin film capacitor 10 is configured in such a way as to hold the dielectric layer 2 between the first electrode layer 1 and the second electrode layer 3.

In the thin film capacitor 10, a ratio ($S/S_0$ ratio) of a surface area S of a surface of the lower electrode layer 1 on an opposite side to the dielectric layer 2 (sometimes referred to as a lower surface 4, hereinafter) to a projected area $S_0$ in a thickness direction of the lower electrode layer 1 (a lamination direction in which the lower electrode layer 1, the dielectric layer 2 and the upper electrode layer 3 are laminated) is 1.01 to 5.00. It is preferable that the $S/S_0$ ratio is 2.50 to 5.00. In order to make the $S/S_0$ ratio exceed 1, irregularities are formed on a surface of the lower surface 4 of the lower electrode layer 1.

The thin film capacitor can be embedded inside a support substrate where a semiconductor element is mounted, in such a direction that the upper electrode layer 3 faces the semiconductor element. Then, since the $S/S_0$ ratio is 1.01 or higher, in the semiconductor device including the semiconductor element and the support substrate in which the thin film capacitor is embedded, generated heat from the semiconductor element can be received in the upper electrode layer 3 and efficiently dissipated from the lower electrode layer 1. In the meantime, since the $S/S_0$ ratio is 5.00 or lower, generation of voids near a lower surface of the lower electrode layer inside the support substrate can be reduced. Since heat conductivity of air is 0.02614 (W/(m·K)) at a temperature 300 (K) and is extremely low compared to metals, decline of heat radiation can be suppressed by reducing a generation amount of voids. The surface area S can be calculated from shape data of the surface obtained by a laser microscope. The projected area $S_0$ may be, for example, 1 to 10000 mm².

From a similar viewpoint, it is preferable that ten-point average roughness Rz of the lower surface 4 of the lower electrode layer 1 is 0.02 to 2.00 μm. By the Rz being in the above-described range, the generated heat from the semiconductor element can be more efficiently dissipated.

A material of the lower electrode layer 1 is selected from conductive materials such as a metal, a metal oxide, or a conductive organic material, for example. Since it is desirable that the lower electrode layer 1 has low electric resistance and high mechanical strength, it is preferable that the material of the lower electrode layer 1 is a metal, and it is more preferable that it is metal foil. Since the metal foil is soft and easily thinned and the thin film capacitor 10 can be thinned, the thin film capacitor obtained using the metal foil is suitable for a semiconductor device manufactured by being embedded in the support substrate.

Examples of the material of the lower electrode layer 1 include, specifically, Fe, Ni, Cu, and Al. It is preferable that the heat conductivity λ of the lower electrode layer 1 is 90 W/(m·K) or higher from the viewpoint of heat radiation. It is preferable that the material of the lower electrode layer 1 is Ni, Cu or Al from the viewpoint of obtaining high heat radiation.

It is preferable that an arithmetical average thickness of the lower electrode layer 1 is 10 to 200 μm, and it is more preferable that it is 10 to 70 Since the arithmetical average thickness of the lower electrode layer 1 is 200 μm or smaller, the decline of the heat radiation tends to be suppressed. In addition, since the arithmetical average thickness of the lower electrode layer 1 is 10 μm or larger, sufficient mechanical strength tends to be imparted to the thin film capacitor 10.

Surface roughness of the lower electrode layer 1 is formed, for example, in manufacture of metal foil by electrolysis (electrolytic metal foil), by using an electrolytic drum whose surface state is arbitrarily adjusted and transferring the surface state of the electrolytic drum to the electrolytic metal foil. The surface roughness of the lower electrode layer 1 may be formed by performing reverse sputtering by Ar ion beams to the metal foil, for example. In a method of forming the surface roughness by reverse sputtering, by changing conditions (for example, an applying voltage, irradiation time, and the like) of the reverse sputtering, the surface roughness can be arbitrarily adjusted.

It is preferable that a material of the dielectric layer 2 is a perovskite-type oxide dielectric of a large dielectric constant, and it is preferable that it is a barium titanate based dielectric which does not contain lead from the viewpoint of environmental preservation. The barium titanate based dielectric may be the one in which part of a Ba site is replaced with alkaline earth metal atoms such as Ca or Sr, or may be the one in which part of a Ti site is replaced with atoms such as Zr, Sn or Hf. Further, atoms such as rare earth elements, Mn, V, Nb, or Ta may be added to these dielectrics.

It is preferable that a thickness of the dielectric layer 2 is 1000 nm or smaller. When the thickness of the dielectric layer 2 is 1000 nm or smaller, the heat radiation tends not to be damaged, and a capacity value per unit area tends to become high. While a lower limit value of the thickness of the dielectric layer 2 is not limited in particular, from the viewpoint that an insulation resistance value does not become too small, it is preferable that it is 50 nm or larger. It is more preferable that the thickness of the dielectric layer 2 is 250 to 1000 nm, in consideration of balance between the insulation resistance value and capacity. Note that, in the dielectric layer 2, sometimes a defect which is stochastically hard to avoid is included.

The dielectric layer 2 is formed on an upper surface of the lower electrode layer 1 by application of a solution, sputtering, vapor deposition, PLD (Pulse Laser deposition), CVD (Chemical Vapor Deposition) or the like, for example.

A material of the upper electrode layer 3 is selected from conductive materials such as a metal, a metal oxide, or a conductive organic material, for example. Since it is desirable that the upper electrode layer 3 has low electric resistance and high mechanical strength, it is preferable that the material of the upper electrode layer 3 is a metal.

Examples of the material of the upper electrode layer 3 include, specifically, Fe, Ni, Cu, and Al. It is preferable that the heat conductivity λ of the upper electrode layer 3 is 90 W/(m·K) or higher from the viewpoint of heat radiation. Therefore, it is preferable that the material of the upper electrode layer 3 is Ni, Cu or Al from the viewpoint of obtaining high heat radiation. The upper electrode layer 3 may be a single layer or may be a plurality of layers. In the case that the upper electrode layer 3 is the plurality of layers, the upper electrode layer 3 may be a laminated body formed of a Ni layer and a Cu layer, for example. In the case that the upper electrode layer 3 includes the Ni layer, it is preferable that the Ni layer is in contact with the dielectric layer 2.

It is preferable that a thickness of the upper electrode layer 3 is 0.1 to 2.0 µm. Since the thickness of the upper electrode layer 3 is 2.0 µm or smaller, the heat radiation tends not to be damaged.

The upper electrode layer 3 is formed on a surface of the dielectric layer 2 on an opposite side to the lower electrode layer 1 by application of a solution, sputtering, vapor deposition, PLD, CVD or the like, for example.

(Semiconductor Device)

Figure 2:
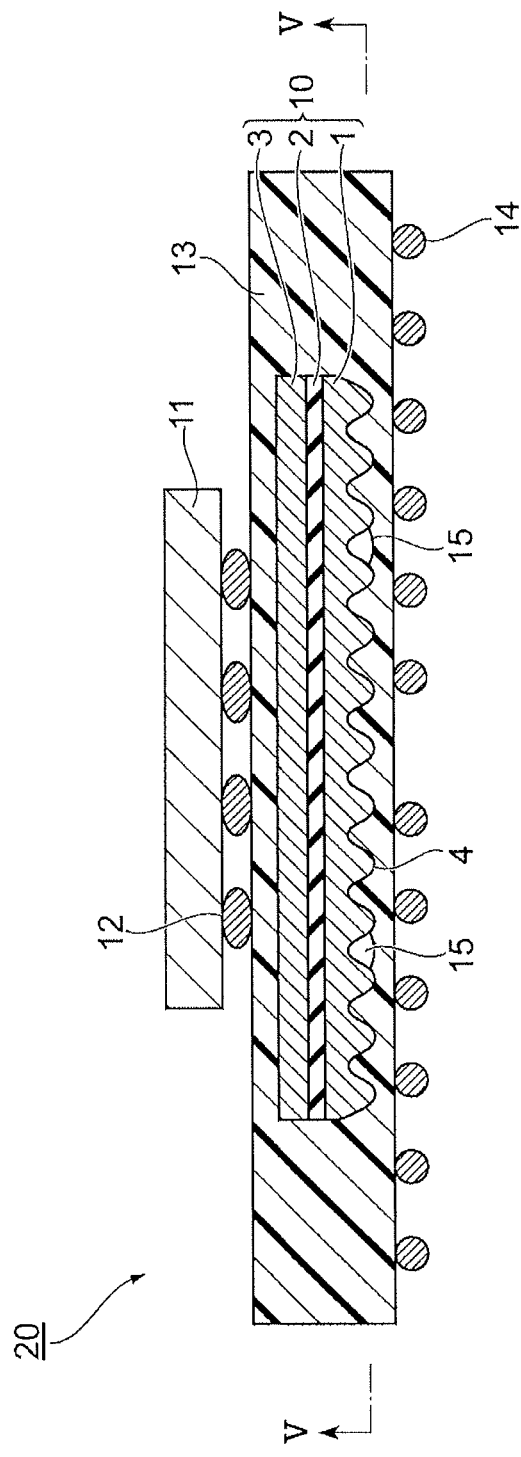
FIG. 2 is a schematic sectional view of a semiconductor device relating to one embodiment of the present invention.

FIG. 2 is a schematic sectional view of a semiconductor device relating to one embodiment of the present invention. A semiconductor device 20 of the present embodiment comprises a support substrate 13, a semiconductor element 11 mounted on one main surface of the support substrate 13, and the thin film capacitor 10 described above. The thin film capacitor 10 is embedded inside the support substrate 13 in such a way that the second electrode layer (upper electrode layer) 3 and the semiconductor element 11 face each other. By embedding the thin film capacitor 10 inside the support substrate 13, it is possible to suppress short-circuit defects caused by solder of a bump or the like being fused and brought into contact with the thin film capacitor, without having a complicated structure.

The semiconductor element 11 has spherical bumps 12 on a lower surface thereof, and the spherical bumps 12 are connected to wiring (not shown in the figure) exposed on an upper surface of the support substrate 13. The support substrate 13 includes spherical bumps 14 on a lower surface thereof, and the spherical bumps 14 are connected to wiring (not shown in the figure) exposed on the lower surface of the support substrate 13. The spherical bumps 14 are connected to an electrode of a mother board (not shown in the figure) arranged thereunder.

The wiring inside the support substrate 13 connects the bumps 14, the bumps 12, the upper electrode layer 3 and the lower electrode layer 1, and forms a wiring structure that makes the thin film capacitor 10 function as a bypass capacitor of the semiconductor element 11.

Generated heat from the semiconductor element 11 is transferred through the spherical bumps 12 and an upper side part of the support substrate 13 to the thin film capacitor 10, and is further transferred through a lower side part of the support substrate 13 and the spherical bumps 14 to the mother board. In other words, the thin film capacitor 10 also has a function as a radiator plate that releases the generated heat from the semiconductor element 11 to the mother board. Note that, since the mother board has a sufficiently wide area compared to the semiconductor device 20 comprising the thin film capacitor 10, it can be considered that the heat transferred to the mother board is released to the outside of a system.

The support substrate 13 is obtained by curing a prepreg including a resin and glass cloth, for example. The prepreg is not limited in particular, and a commercially available prepreg is used. The thin film capacitor 10 is arranged between two sheets of the prepregs, and by heating and pressurizing the thin film capacitor 10 and the two sheets of the prepregs, the thin film capacitor 10 is embedded inside the support substrate 13 as the resin in the prepregs flows and is cured. It is preferable that a thickness of the support substrate 13 is 50 to 700 µm, and it is more preferable that it is 50 to 400 µm. Since the thickness of the support substrate 13 is 700 µm or smaller, an effect of the heat radiation tends not to be damaged. Since the thickness of the support substrate 13 is 50 µm or larger, appropriate strength tends to be imparted to the semiconductor device. Examples of the semiconductor element 11 include a transistor, an IC, and an LSI.

The semiconductor device 20 of the present embodiment sometimes includes voids 15 near the lower surface 4 of the lower electrode layer 1 inside the support substrate 13. It is preferable to suppress the number of the voids 15 that the semiconductor device 20 has to be a certain number or smaller so as not to damage the effect of the heat radiation.

EXAMPLES

Hereinafter, the present invention will be specifically described with examples, however, the present invention is not limited thereto.

[Measuring Method]

(Measuring Method of Surface Area S)

The surface area S of the lower surface 4 of the lower electrode layer 1 of the thin film capacitor 10 obtained in the examples and comparative examples described below was measured by a non-contact sectional roughness measuring instrument (product name: NH-3N, made by Mitaka Kohki Co., Ltd.).

(Measuring Method of Ten-Point Average Roughness Rz)

A roughness curve of the lower surface 4 of the lower electrode layer 1 of the thin film capacitor 10 obtained in the examples and comparative examples described below was probed and measured by a contact type surface roughness tester (product name: SURFCOM 1500S, made by TOKYO SEIMITSU Co., Ltd.), and the ten-point average roughness Rz was calculated. Note that the ten-point average roughness Rz refers to a value for which only a reference length is sampled from the roughness curve in a direction of an average line thereof, a sum of an average value of absolute values of heights of peaks to the fifth from the highest peak and an average value of absolute values of heights of bottoms to the fifth from the lowest bottom, measured from the average line of the sampled part in a direction of longitudinal magnification, is obtained, and the value is indicated in micrometers (see JIS B0601 (2013) Annex JA).

Examples 1 to 3 and Comparative Examples 1 to 9

[Manufacture of Thin Film Capacitor and Semiconductor Device]

The thin film capacitor 10 comprising the lower electrode layer 1, the upper electrode layer 3, and the dielectric layer 2 provided between the lower electrode layer 1 and the upper electrode layer 3 was manufactured. For the lower electrode layer 1, electrolytic Ni foil with the projected area $S_0$ in the thickness direction of 100 mm$^2$ and arithmetical average thickness of 40 µm was used, and by adjusting the surface state of the electrolytic drum, the surface area S of one surface (lower surface) was changed in a range of 100 mm$^2$ to 1000 mm$^2$ as described in the table 1 below. The dielectric layer 2 was formed of $BaTiO_3$ with the thickness of 800 nm, and was formed on the other surface (upper surface) of the lower electrode layer 1. The upper electrode layer 3 was formed by laminating a Ni layer with the thickness of 0.5 µm, a Cu layer with the thickness of 1.0 µm, and a Cu layer with the thickness of 16.5 µm on the dielectric layer 2 in this order.

By arranging the obtained thin film capacitor 10 between two sheets of the prepregs (product name: MEGTRON, made by Panasonic Corporation) and heating and pressurizing them, the support substrate 13 of 70 mm×70 mm×200

μm in which the thin film capacitor 10 was embedded was obtained. After forming an extracting electrode on the support substrate 13, the semiconductor element 11 was mounted through the spherical bumps 12 on the extracting electrode formed on the main surface on the side of the upper electrode layer 3 of the support substrate 13, and the semiconductor devices 20 in the examples 1 to 3 and the comparative examples 1 to 9 having the thin film capacitor as a bypass capacitor were manufactured. The surface area S of the lower surface 4 of the lower electrode layer 1, the projected area $S_0$ in the thickness direction of the lower electrode layer 1, the $S/S_0$ ratio, and the ten-point average roughness Rz of the lower surface 4 in the semiconductor devices 20 in the examples 1 to 3 and the comparative examples 1 to 9 are indicated altogether in Table 1.

TABLE 1

| | Surface area S (mm$^2$) | Projected area $S_0$ (mm$^2$) | $S/S_0$ ratio | Ten-point average roughness Rz (μm) |
|---|---|---|---|---|
| Comparative example 1 | 100 | 100 | 1.000 | 0.014 |
| Comparative example 2 | 100.2 | 100 | 1.002 | 0.015 |
| Comparative example 3 | 100.4 | 100 | 1.004 | 0.017 |
| Comparative example 4 | 100.7 | 100 | 1.007 | 0.019 |
| Example 1 | 101 | 100 | 1.010 | 0.021 |
| Example 2 | 250 | 100 | 2.500 | 1.01 |
| Example 3 | 500 | 100 | 5.000 | 4.05 |
| Comparative example 5 | 600 | 100 | 6.000 | 5.116 |
| Comparative example 6 | 700 | 100 | 7.000 | 6.244 |
| Comparative example 7 | 800 | 100 | 8.000 | 7.511 |
| Comparative example 8 | 900 | 100 | 9.000 | 9.37 |
| Comparative example 9 | 1000 | 100 | 10.000 | 10.46 |

[Heat Radiation Test]

Figure 3A:
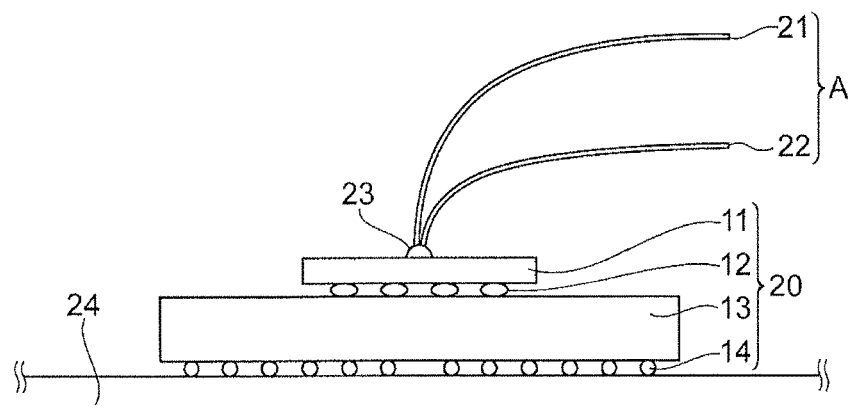
FIG. 3A and FIG. 3B are schematic diagrams for explaining a measurement method of a semiconductor element temperature in a heat radiation test.
Figure 3B:
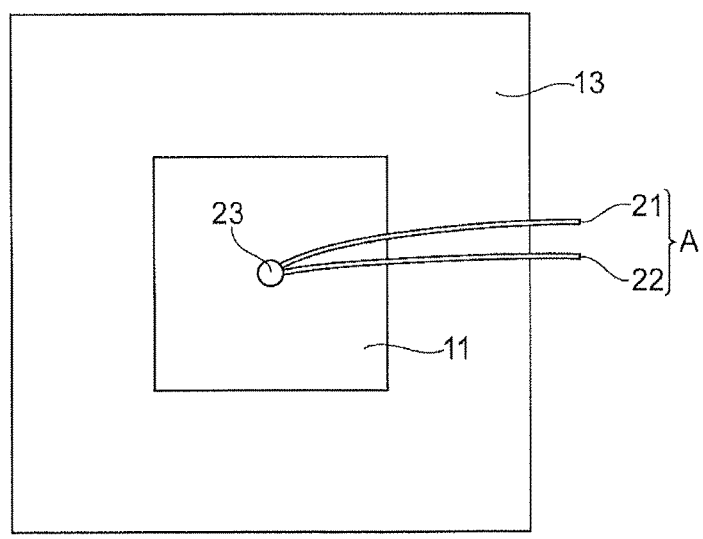

As illustrated in FIG. 3A and FIG. 3B, the extracting electrode formed on the main surface on the side of the lower electrode layer 1 of the support substrate 13 was connected with a mother board 24 through the spherical bumps 14. Next, a hot junction 23 of a positive terminal 21 and a negative terminal 22 of a thermocouple A was provided on the upper surface of the semiconductor element 11 of the manufactured semiconductor device 20 so as to measure the temperature of the semiconductor device. For the thermocouple A, a K type thermocouple was used. The semiconductor device 20 and the thermocouple A were arranged inside a thermostatic chamber set at 300 K. After the lapse of sufficient time, it was confirmed that the temperature of the semiconductor element 11 became the almost same as a temperature set value of the thermostatic chamber.

Power of 50 W was supplied to the semiconductor element 11, and the temperature of the semiconductor element 11 from after 0 millisecond to after 2000 milliseconds after the power supply was measured every 200 milliseconds. Measured results of the temperature of the semiconductor element 11 in the examples 1 to 3 and the comparative examples 1 to 9 are indicated in Table 2 below. Note that, when the inside of the support substrate 13 in which the thin film capacitor 10 was embedded was observed using an X-ray CT scanner, the surface area S of the lower surface 4 of the lower electrode layer 1 did not change from that before the thin film capacitor 10 was embedded, and it was continued that the lower electrode layer 1 was not deformed in a semiconductor device manufacturing process.

TABLE 2

| | | Elapsed time after power supply and semiconductor element temperature (K) | | | | | | | | | | |
|---|---|---|---|---|---|---|---|---|---|---|---|---|
| | $S/S_0$ ratio | 0 Milli-seconds | 200 Milli-seconds | 400 Milli-seconds | 600 Milli-seconds | 800 Milli-seconds | 1000 Milli-seconds | 1200 Milli-seconds | 1400 Milli-seconds | 1600 Milli-seconds | 1800 Milli-seconds | 2000 Milli-seconds |
| Comparative example 1 | 1.000 | 300.1 | 332.7 | 340.5 | 343.2 | 344.3 | 344.2 | 344.7 | 344.5 | 344.2 | 344.6 | 344.5 |
| Comparative example 2 | 1.002 | 300.0 | 329.8 | 337.2 | 339.5 | 340.0 | 340.2 | 340.1 | 340.0 | 339.8 | 340.1 | 340.3 |
| Comparative example 3 | 1.004 | 299.9 | 328.5 | 335.8 | 337.1 | 337.4 | 337.1 | 337.3 | 337.3 | 337.1 | 337.0 | 337.2 |
| Comparative example 4 | 1.007 | 300.2 | 327.3 | 332.4 | 332.6 | 332.5 | 332.3 | 332.4 | 332.2 | 332.3 | 332.4 | 332.4 |
| Example 1 | 1.010 | 300.1 | 325.2 | 328.1 | 328.5 | 328.3 | 328.3 | 328.1 | 328.5 | 328.5 | 328.3 | 328.4 |
| Example 2 | 2.500 | 300.2 | 323.5 | 325.6 | 325.6 | 325.8 | 325.5 | 325.7 | 325.7 | 325.6 | 325.6 | 325.7 |
| Example 3 | 5.000 | 299.8 | 323.1 | 325.4 | 325.5 | 325.4 | 325.6 | 325.4 | 325.5 | 325.3 | 325.2 | 325.3 |
| Comparative example 5 | 6.000 | 300.1 | 333.5 | 344.1 | 345.1 | 345.7 | 345.8 | 345.6 | 345.9 | 345.7 | 345.5 | 345.6 |
| Comparative example 6 | 7.000 | 299.9 | 341.7 | 354.7 | 357.7 | 358.9 | 359.2 | 359.0 | 359.1 | 358.8 | 359.0 | 358.9 |
| Comparative example 7 | 8.000 | 299.7 | 352.3 | 363.5 | 365.7 | 365.8 | 365.6 | 365.6 | 365.6 | 365.3 | 365.5 | 365.4 |
| Comparative example 8 | 9.000 | 300.1 | 356.5 | 368.1 | 370.4 | 370.5 | 370.3 | 370.1 | 370.4 | 370.2 | 370.0 | 370.2 |
| Comparative example 9 | 10.000 | 300.2 | 358.1 | 369.5 | 371.9 | 372.0 | 372.2 | 372.3 | 372.1 | 372.1 | 372.0 | 372.1 |

Figure 4:
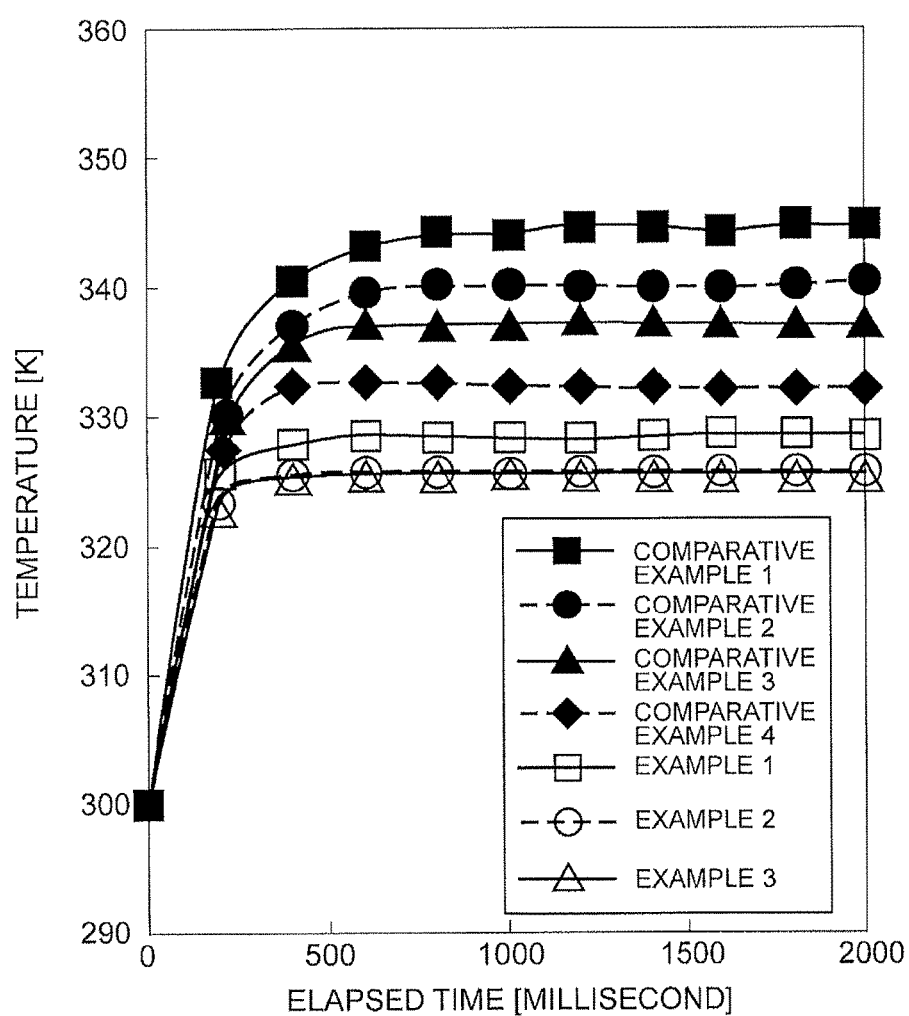
FIG. 4 is a graph illustrating a relation between the semiconductor element temperature (K) of the semiconductor device in examples 1 to 3 and comparative examples 1 to 4 and elapsed time (milliseconds) after power supply.
Figure 5:
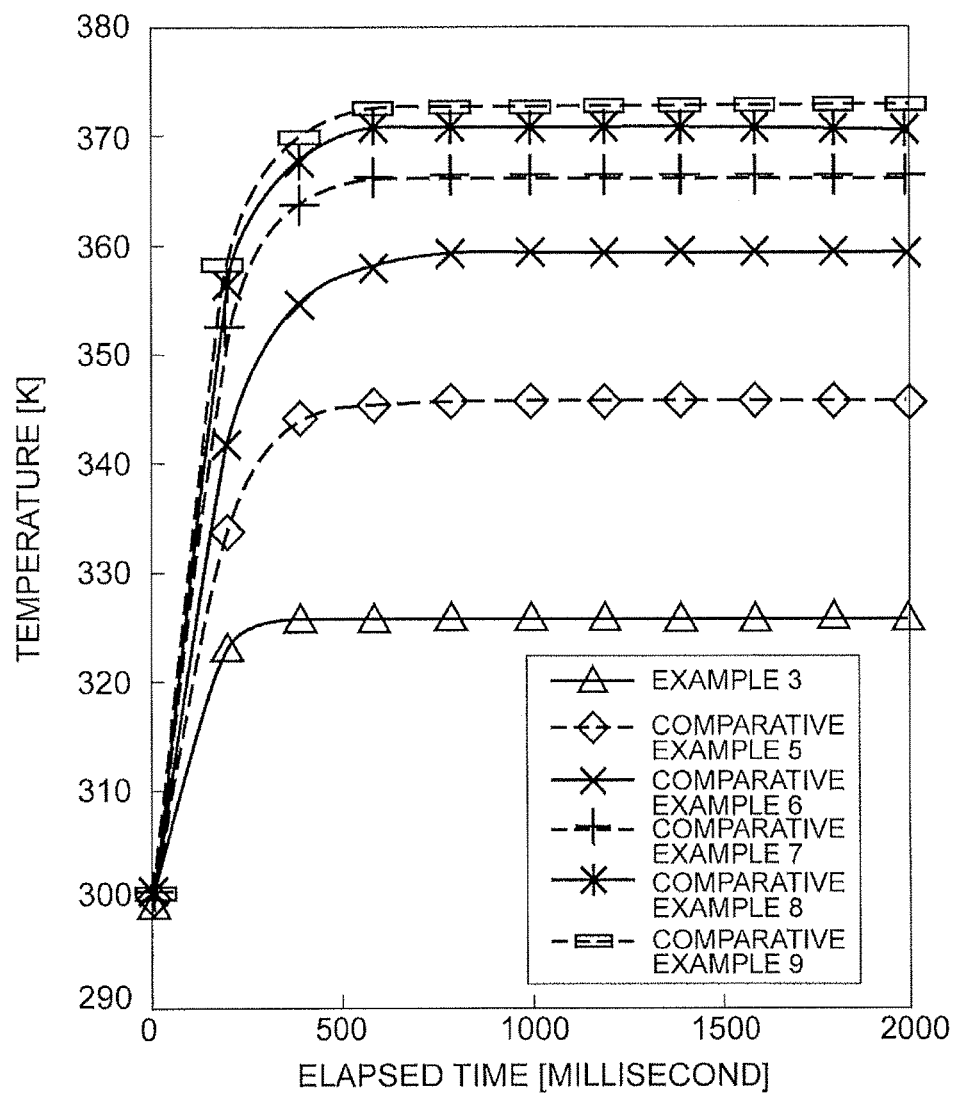
FIG. 5 is a graph illustrating a relation between the semiconductor element temperature (K) of the semiconductor device in the example 3 and comparative examples 5 to 9 and elapsed time (milliseconds) after power supply.

Table 2 is made into graphs in FIG. 4 and FIG. 5. That is, FIG. 4 is a graph illustrating a relation between the semiconductor element temperature (K) of the semiconductor devices in the examples 1 to 3 and the comparative examples 1 to 4 and the elapsed time (milliseconds) after the power supply. Also, FIG. 5 is a graph illustrating a relation between the semiconductor element temperature (K) of the semiconductor devices in the example 3 and the comparative examples 5 to 9 and the elapsed time (milliseconds) after the power supply. From Table 2, FIG. 4 and FIG. 5, it can be confirmed that, in any one of the examples and the comparative examples, the semiconductor element temperature rises immediately after the power is supplied to the semiconductor element 11, but the heat generation of the semiconductor element 11 by the power supply and heat radiation to the mother board through the thin film capacitor 10 are balanced and the semiconductor element temperature is stable after 2000 milliseconds.

When the examples 1 to 3 and the comparative examples 1 to 4 are compared with reference to Table 2 and FIG. 4, it can be confirmed that a reaching point of the semiconductor element temperature lowers as the $S/S_0$ ratio becomes large. It is conceivable that it is due to increase of a radiation amount (a heat transfer amount of the thin film capacitor 10) by increase of the $S/S_0$ ratio. However, when the example 2, the example 3 and the comparative examples 5 to 9 are compared with reference to Table 2, FIG. 4 and FIG. 5, it can be confirmed that a lowering tendency of the reaching point of the semiconductor element temperature is eliminated from around the point where the $S/S_0$ ratio exceeds 2.500, and it changes to rising to the contrary from around the point where the $S/S_0$ ratio exceeds 5.000. It is conceivable that it is because that the voids 15 tend to be generated near the lower surface 4 of the lower electrode layer 1 inside the support substrate 13 when embedding the thin film capacitor 10 inside the support substrate 13 due to the increase of the $S/S_0$ ratio, the number of the voids 15 increases, and the heat conductivity lowers as a result.

Figure 6:
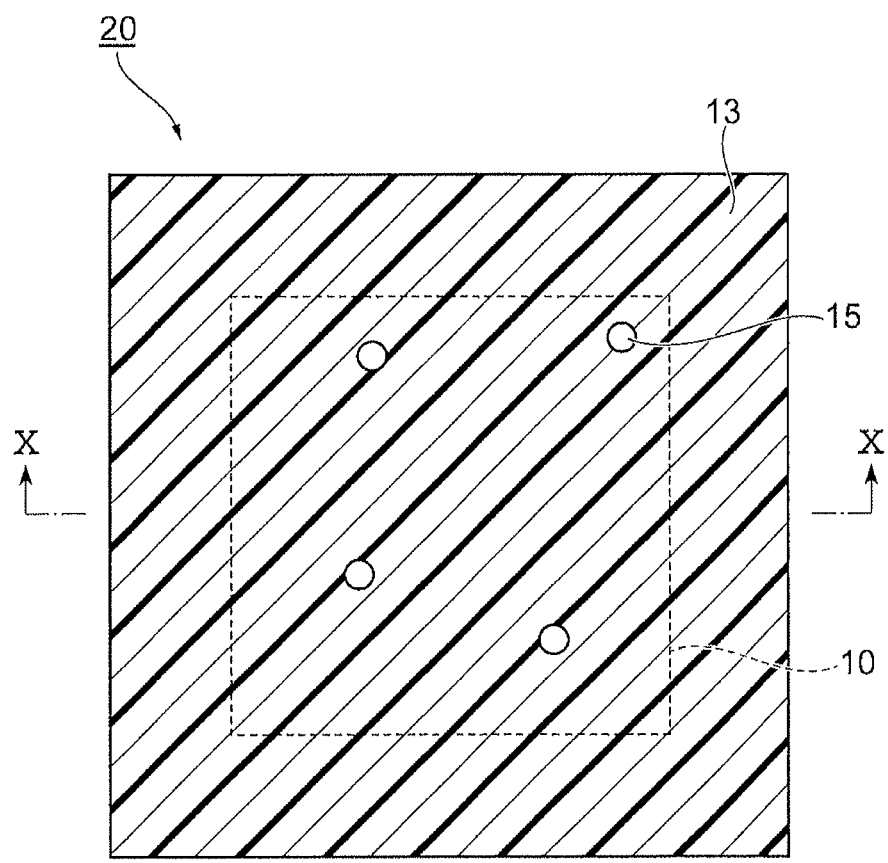
FIG. 6 is a cross-sectional view along a V-V line of the semiconductor device illustrated in FIG. 2.

FIG. 6 is a schematic diagram of a cross-sectional view along a V-V line of the semiconductor device illustrated in FIG. 2. When a cross section along the V-V line illustrated in FIG. 6 was observed using an X-ray CT scanner for the semiconductor devices after the heat radiation test obtained in the examples and the comparative examples, the voids 15 were dotted near the lower surface 4 of the lower electrode layer 1. Further, the semiconductor devices after the heat radiation test obtained in the examples and the comparative examples were cut along an X-X line illustrated in FIG. 6, a cut section was observed, and the number of the voids 15 was counted.

Figure 7:
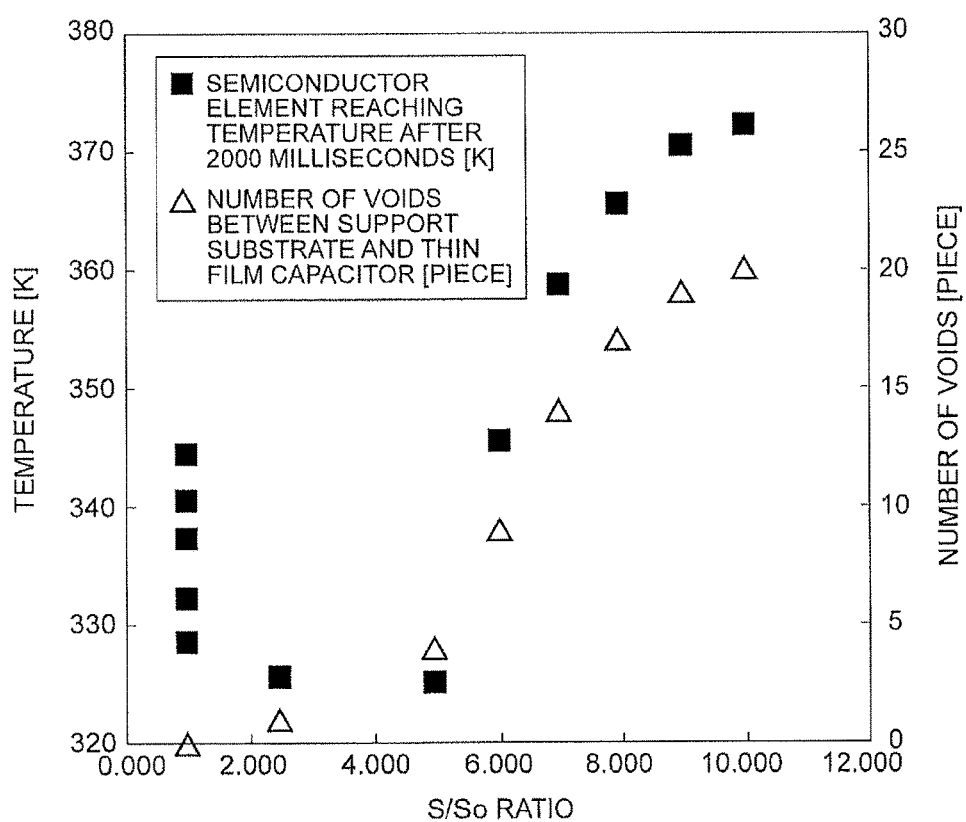
FIG. 7 is a graph illustrating a relation between an $S/S_0$ ratio of the semiconductor device obtained in the examples 1 to 3 and the comparative examples 1 to 9, the semiconductor element temperature (K) after 2000 milliseconds in a heat radiation test, and the number (pieces) of voids near a lower surface 4 of a lower electrode layer 1 inside a support substrate 13.

FIG. 7 is a graph illustrating a relation between the $S/S_0$ ratio of the semiconductor devices obtained in the examples 1 to 3 and the comparative examples 1 to 9, the reaching point (semiconductor element reaching temperature) (K) of the semiconductor element temperature after 2000 milliseconds in the heat radiation test, and the number of the voids 15 near the lower surface 4 of the lower electrode layer 1 inside the support substrate 13 (the number of the voids 15 between the support substrate and the thin film capacitor) (pieces). From the graph illustrated in FIG. 7, it can be confirmed that the number of the voids 15 tends to increase from around the point where the $S/S_0$ ratio exceeds 5.000, and the semiconductor element temperature simultaneously rises. From this, it is conceivable that the increase of the voids 15 is a cause of the rise of the semiconductor element temperature. In addition, from the graph illustrated in FIG. 7, it can be confirmed that the semiconductor element temperature rises from around the point where the number of the voids 15 becomes eight pieces or more.

For example, in order for the semiconductor element used in a personal computer to stably operate, it is desirable that the semiconductor element temperature is around 323 (K) (50° C. Celsius). Also, when the semiconductor element temperature exceeds 343 (K) (70° C. Celsius), an operation of the semiconductor element becomes instable. It was confirmed that, in the semiconductor devices obtained in the examples 1 to 3, the semiconductor element temperature of 343 (K) or below was maintained even after the power was supplied to the semiconductor element.

Example 4 and Example 5

Other than using electrolytic Fe foil and electrolytic Cu foil respectively instead of the electrolytic Ni foil as the lower electrode layer 1, the semiconductor devices 20 in the example 4 and the example 5 were manufactured similarly to the example 1. To the semiconductor devices obtained in the example 4 and the example 5, the heat radiation test was conducted by the process similar to that of the example 1. The material of the lower electrode layer 1, the $S/S_0$ ratio, the heat conductivity λ of the lower electrode layer 1, the ten-point average roughness Rz of the lower surface 4, and the reaching point of the semiconductor element temperature after 2000 milliseconds in the heat radiation test in the semiconductor devices 20 of the example 4 and the example 5 are indicated altogether in Table 3.

TABLE 3

|  | Lower electrode layer | | | | Reaching point of semiconductor element temperature after 2000 milliseconds (K) |
| --- | --- | --- | --- | --- | --- |
|  | Material | $S/S_0$ ratio | Heat conductivity λ (W/(m · K)) | Ten-point average roughness Rz (μm) |  |
| Example 4 | Iron | 1.01 | 80.3 | 0.023 | 341.2 |
| Example 1 | Nickel | 1.01 | 90.9 | 0.021 | 328.4 |
| Example 5 | Copper | 1.01 | 398 | 0.023 | 318.3 |

According to Table 3, it was confirmed that, while the semiconductor element temperature rises close to an upper limit of a stable operation temperature of the semiconductor element in the example 4 in which the material of the lower electrode layer 1 of the thin film capacitor 10 is iron, it is sufficiently below an upper limit value of the stable operation temperature of the semiconductor element in the example 1 and the example 5 in which the material of the lower electrode layer 1 of the thin film capacitor 10 is nickel and copper respectively.

Examples 6 to 12

FIG. 8 is a schematic sectional view of the semiconductor devices obtained in the examples 6 to 12. Other than using the electrolytic Ni foil for which the surface roughness of the lower surface 4 was adjusted by reverse sputtering by Ar ion beams for the lower electrode layer 1, the semiconductor devices in the examples 6 to 12 were manufactured similarly to the example 1. Note that, in the examples 6 to 12, the reverse sputtering was performed in such a way that the ten-point average roughness Rz of the lower surface 4 of the electrolytic Ni foil became 0.02 µm, 0.10 µm, 0.50 µm, 1.00 µm, 2.00 µm, 3.00 µm and 4.00 µm respectively. For each example, five each of the semiconductor devices were manufactured, and the heat radiation test was conducted to the respective semiconductor devices by the process similar to that of the example 1. Note that, when the inside of the support substrate 13 in which the thin film capacitor 10 was embedded was observed using an X-ray CT scanner, the ten-point average roughness Rz of the lower surface 4 of the lower electrode layer 1 did not change from that before the thin film capacitor 10 was embedded, and it was confirmed that the lower electrode layer 1 was not deformed in the semiconductor device manufacturing process. The ten-point average roughness Rz of the lower surface 4, the $S/S_0$ ratio, the number of the voids 15 near the lower surface 4 of the lower electrode layer 1 inside the support substrate 13, and the reaching point of the semiconductor element temperature after 2000 milliseconds in the heat radiation test in the semiconductor devices of the examples 6 to 12 are indicated altogether in Table 4.

From Table 4, it can be confirmed that, while the number of the voids is settled within two pieces in the examples 6 to 10, the number of the voids increases to four to six pieces in the examples 11 and 12. In the meantime, it was recognized that, when paying attention to the semiconductor element temperature after 2000 milliseconds in the heat radiation test, while the semiconductor element temperature is around 323 (K) (50° C. Celsius) and is close to a recommended temperature, at which the semiconductor element stably operates, in the examples 6 to 10, the semiconductor element temperature increases close to 343 (K) (70° C. Celsius) but is equal to or below the upper limit of the temperature at which the semiconductor stably operates in the examples 11 and 12. It is conceivable that the increase of the semiconductor element temperature in the examples 11 and 12 is due to the increase of the number of the voids compared to the examples 6 to 10. Note that, in five each of the semiconductor devices prepared respectively in the examples 6 to 12, the relation between the $S/S_0$ ratio and the ten-point average roughness Rz in the individual samples was not determined, and it was confirmed that the $S/S_0$ ratio and the ten-point average roughness Rz are not necessarily equivalent indexes.

Examples 13 to 19

Other than using the electrolytic Fe foil instead of the electrolytic Ni foil as the lower electrode layer 1, the

TABLE 4

| | Sample No. | 1 | 2 | 3 | 4 | 5 | Average |
|---|---|---|---|---|---|---|---|
| Example 6 | Ten-point average roughness Rz (µm) | 0.021 | 0.023 | 0.02 | 0.021 | 0.022 | 0.021 |
| | $S/S_0$ ratio | 1.021 | 1.013 | 1.052 | 1.021 | 1.064 | 1.034 |
| | Number of voids | 0 | 0 | 0 | 0 | 0 | 0 |
| | Reaching point of semiconductor element temperature after 2000 milliseconds (K) | 327.4 | 328.6 | 326.9 | 327.2 | 326.5 | 327.3 |
| Example 7 | Ten-point average roughness Rz (µm) | 0.103 | 0.102 | 0.104 | 0.102 | 0.101 | 0.102 |
| | $S/S_0$ ratio | 1.221 | 1.087 | 1.167 | 1.134 | 1.204 | 1.163 |
| | Number of voids | 1 | 0 | 0 | 0 | 1 | 0.4 |
| | Reaching point of semiconductor element temperature after 2000 milliseconds (K) | 326 | 327.1 | 326.6 | 326.5 | 326.4 | 326.5 |
| Example 8 | Ten-point average roughness Rz (µm) | 0.503 | 0.501 | 0.499 | 0.502 | 0.497 | 0.5 |
| | $S/S_0$ ratio | 1.334 | 1.221 | 1.501 | 1.423 | 1.397 | 1.375 |
| | Number of voids | 1 | 0 | 1 | 1 | 1 | 0.8 |
| | Reaching point of semiconductor element temperature after 2000 milliseconds (K) | 326.1 | 326.5 | 326.3 | 326.1 | 326.7 | 326.3 |
| Example 9 | Ten-point average roughness Rz (µm) | 0.999 | 1.001 | 1.002 | 0.997 | 1.002 | 1 |
| | $S/S_0$ ratio | 2.118 | 1.994 | 2.117 | 2.352 | 1.782 | 2.073 |
| | Number of voids | 2 | 1 | 1 | 2 | 1 | 1.4 |
| | Reaching point of semiconductor element temperature after 2000 milliseconds (K) | 325.9 | 326.3 | 326.2 | 326.3 | 326.1 | 326.2 |
| Example 10 | Ten-point average roughness Rz (µm) | 1.995 | 1.994 | 1.997 | 2 | 1.998 | 1.997 |
| | $S/S_0$ ratio | 4.552 | 3.653 | 4.331 | 4.721 | 3.298 | 4.111 |
| | Number of voids | 1 | 2 | 1 | 2 | 1 | 1.4 |
| | Reaching point of semiconductor element temperature after 2000 milliseconds (K) | 325.5 | 325.4 | 325.1 | 325.2 | 325.3 | 325.3 |
| Example 11 | Ten-point average roughness Rz (µm) | 3.005 | 2.996 | 2.997 | 3.001 | 3.003 | 3 |
| | $S/S_0$ ratio | 4.892 | 4.781 | 4.811 | 3.921 | 4.487 | 4.578 |
| | Number of voids | 5 | 4 | 4 | 5 | 5 | 4.6 |
| | Reaching point of semiconductor element temperature after 2000 milliseconds (K) | 339.1 | 339.3 | 339.6 | 339.2 | 339.5 | 339.3 |
| Example 12 | Ten-point average roughness Rz (µm) | 4.003 | 4.001 | 3.998 | 4 | 4.001 | 4.001 |
| | $S/S_0$ ratio | 4.821 | 4.921 | 3.992 | 4.539 | 4.991 | 4.653 |
| | Number of voids | 6 | 6 | 5 | 6 | 6 | 5.8 |
| | Reaching point of semiconductor element temperature after 2000 milliseconds (K) | 341.1 | 341.1 | 341.3 | 341.2 | 341.5 | 341.2 | semiconductor devices 20 in the examples 13 to 19 were manufactured similarly to the examples 6 to 12. To the semiconductor devices obtained in the examples 13 to 19, the heat radiation test was conducted by the process similar to that of the example 6. The material of the lower electrode layer 1, the heat conductivity λ of the lower electrode layer 1, the $S/S_0$ ratio, the ten-point average roughness Rz of the lower surface 4, and the reaching point of the semiconductor element temperature after 2000 milliseconds in the heat radiation test in the semiconductor devices 20 of the examples 13 to 19 are indicated altogether in Table 5.

Examples 20 to 26

Other than using the electrolytic Cu foil instead of the electrolytic Ni foil as the lower electrode layer 1, the semiconductor devices 20 in the examples 20 to 26 were manufactured similarly to the examples 6 to 12. To the semiconductor devices obtained in the examples 20 to 26, the heat radiation test was conducted by the process similar to that of the example 6. The material of the lower electrode layer 1, the $S/S_0$ ratio, the ten-point average roughness Rz of the lower surface 4, the heat conductivity λ of the lower electrode layer 1, and the reaching point of the semiconductor element temperature after 2000 milliseconds in the heat radiation test in the semiconductor devices 20 of the examples 20 to 26 are indicated altogether in Table 5.

TABLE 5

|  |  | Example 13 | Example 14 | Example 15 | Example 16 | Example 17 | Example 18 | Example 19 |
|---|---|---|---|---|---|---|---|---|
| Lower electrode layer | Material | | | | Iron | | | |
| | Heat conductivity λ (W/(m · K)) | | | | 80.3 | | | |
| | $S/S_0$ ratio | 1.022 | 1.211 | 1.451 | 2.038 | 4.515 | 4.622 | 4.886 |
| | Ten-point average roughness Rz (μm) | 0.021 | 0.103 | 0.501 | 0.999 | 1.996 | 3.003 | 4.001 |
| Reaching point of semiconductor element temperature after 2000 milliseconds (K) | | 338.4 | 338.1 | 338.3 | 338.1 | 338.5 | 342.1 | 342.4 |

|  |  | Example 6 | Example 7 | Example 8 | Example 9 | Example 10 | Example 11 | Example 12 |
|---|---|---|---|---|---|---|---|---|
| Lower electrode layer | Material | | | | Nickel | | | |
| | Heat conductivity λ (W/(m · K)) | | | | 90.9 | | | |
| | $S/S_0$ ratio | 1.034 | 1.163 | 1.375 | 2.073 | 4.111 | 4.578 | 4.653 |
| | Ten-point average roughness Rz (μm) | 0.021 | 0.102 | 0.5 | 1 | 1.997 | 3 | 4.001 |
| Reaching point of semiconductor element temperature after 2000 milliseconds (K) | | 327.3 | 326.5 | 326.3 | 326.2 | 325.3 | 339.3 | 341.2 |

|  |  | Example 20 | Example 21 | Example 22 | Example 23 | Example 24 | Example 25 | Example 26 |
|---|---|---|---|---|---|---|---|---|
| Lower electrode layer | Material | | | | Copper | | | |
| | Heat conductivity λ (W/(m · K)) | | | | 398 | | | |
| | $S/S_0$ ratio | 1.027 | 1.206 | 1.399 | 2.051 | 4.322 | 4.547 | 4.723 |
| | Ten-point average roughness Rz (μm) | 0.022 | 0.103 | 0.498 | 1.001 | 1.997 | 2.998 | 4.003 |
| Reaching point of semiconductor element temperature after 2000 milliseconds (K) | | 316.1 | 316.3 | 316.2 | 316.1 | 316.5 | 317.9 | 318.1 |

From Table 5, in the examples 13 to 17, the examples 6 to 10 and the examples 20 to 24 in which the ten-point average roughness Rz was set to be 2.00 μm or smaller, the rise of the semiconductor element temperature in the heat radiation test was not confirmed. On the other hand, in the examples 18 and 19, the examples 11 and 12 and the examples 25 and 26 in which the ten-point average roughness Rz was set to be about 3.00 μm or larger, the rise of the semiconductor element temperature in the heat radiation test was confirmed. However, in the examples 18 and 19 and the examples 11 and 12 in which the material of the lower electrode layer 1 of the thin film capacitor 10 is nickel or copper, it was confirmed that the semiconductor element temperature is close to the recommended temperature at which a stable operation is possible. In addition, in the examples 25 and 26 in which the material of the lower electrode layer 1 of the thin film capacitor 10 is iron, it was recognized that the semiconductor element temperature increases close to 343 (K) (70° C. Celsius) but is equal to or below the upper limit of the temperature at which the semiconductor stably operates.

As described above, it was confirmed that the semiconductor device relating to the present invention can efficiently radiate the generated heat from the semiconductor element, and can stably operate even after the power is supplied to the semiconductor element. The above-described semiconductor device can suppress the generation of a short-circuit defect or the like even without having a complicated structure.

What is claimed is:

1. A thin film capacitor comprising:
    a first electrode layer having an upper surface and a lower surface, the upper surface being a flat surface;
    a second electrode layer; and
    a dielectric layer provided between the upper surface of the first electrode layer and the second electrode layer, with the upper surface of the first electrode layer facing the dielectric layer and the lower surface of the first electrode layer facing away from the dielectric layer,
    wherein the lower surface of the first electrode layer has a surface roughness selected so that a ratio ($S/S_0$) of a surface area S of the lower surface of the first electrode layer to a projected area $S_0$ in a thickness direction of the first electrode layer is 1.01 to 5.00.

2. The thin film capacitor according to claim 1, wherein heat conductivity $\lambda$ of the first electrode layer is 90 W/(m·K) or higher.

3. The thin film capacitor according to claim 1, wherein ten-point average roughness Rz of the surface of the first electrode layer on the opposite side to the dielectric layer is 0.02 to 2.00 μm.

4. A semiconductor device comprising:
    a support substrate;
    a semiconductor element mounted on one main surface of the support substrate; and
    the thin film capacitor according to claim 1,
    wherein the thin film capacitor is embedded inside the support substrate in such a way that the second electrode layer and the semiconductor element face each other.

5. The thin film capacitor according to claim 1, wherein the dielectric layer is a flat layer.

* * * * *